(12) United States Patent
Peck

(10) Patent No.: US 10,837,703 B2
(45) Date of Patent: Nov. 17, 2020

(54) THERMAL PROCESS DEVICE WITH NON-UNIFORM INSULATION

(71) Applicant: SANDVIK THERMAL PROCESS INC, Sonora, CA (US)

(72) Inventor: Kevin Peck, Sonora, CA (US)

(73) Assignee: Sandvik Thermal Process Inc., Sonora, CA (US)

( * ) Notice: Subject to any disclaimer, the term of this patent is extended or adjusted under 35 U.S.C. 154(b) by 0 days.

(21) Appl. No.: 15/669,899

(22) Filed: Aug. 5, 2017

(65) Prior Publication Data
US 2018/0038649 A1 Feb. 8, 2018

Related U.S. Application Data

(60) Provisional application No. 62/371,525, filed on Aug. 5, 2016.

(51) Int. Cl.
| | | |
|---|---|---|
| *F27D 1/00* | (2006.01) | |
| *F27B 9/36* | (2006.01) | |
| *F27B 9/06* | (2006.01) | |
| *H01L 21/67* | (2006.01) | |
| *H01L 21/677* | (2006.01) | |
| *F27B 9/34* | (2006.01) | |

(52) U.S. Cl.
CPC .......... *F27D 1/0033* (2013.01); *F27B 9/068* (2013.01); *F27B 9/34* (2013.01); *F27B 9/36* (2013.01); *F27D 1/00* (2013.01); *H01L 21/67109* (2013.01); *H01L 21/67248* (2013.01); *H01L 21/67754* (2013.01); *H01L 21/67757* (2013.01)

(58) Field of Classification Search
CPC .......... F27D 1/0033; F27B 9/068; F27B 9/32; F27B 9/34; F27B 9/36
See application file for complete search history.

(56) References Cited

U.S. PATENT DOCUMENTS

| | | | |
|---|---|---|---|
| 1,416,726 A | * | 5/1922 | McDougal .............. F27B 9/082 264/652 |
| 3,651,240 A | | 3/1972 | Kirkpatrick |
| 4,849,608 A | | 7/1989 | Muraoka et al. |
| 5,038,019 A | * | 8/1991 | McEntire .............. F27B 14/061 219/390 |

(Continued)

FOREIGN PATENT DOCUMENTS

| | | |
|---|---|---|
| WO | 2004105435 A2 | 12/2004 |
| WO | 2004111540 A2 | 12/2004 |
| WO | 2010068703 A1 | 6/2010 |

*Primary Examiner* — Steven S Anderson, II
(74) *Attorney, Agent, or Firm* — Morgan, Lewis & Bockius LLP

(57) ABSTRACT

A thermal process device for heat treating a product or plurality of products includes a thermal processing chamber having opposed distal ends and at least one controllable heating zone. At least one buffer zone disposed is at each of the distal ends, the buffer zones and at least one heating zone of the thermal processing chamber forming a heating element assembly having an inner and outer surface. At least one layer of insulating material is disposed along the at least one buffer and heating zones of the thermal processing chamber and forming part of the heating element assembly, the at least one layer of insulating material having a controlled efficiency being applied non-uniformly across an axial length of the heating assembly.

11 Claims, 3 Drawing Sheets

(56) References Cited

U.S. PATENT DOCUMENTS

| | | | |
|---|---|---|---|
| 2005/0229748 A1* | 10/2005 | Bleifuss | C21B 11/00 75/483 |
| 2006/0029898 A1* | 2/2006 | Saijo | F27B 5/04 432/247 |
| 2010/0110175 A1* | 5/2010 | Kolek | C21D 9/0006 348/135 |
| 2010/0226629 A1* | 9/2010 | Basol | C23C 14/5866 392/407 |
| 2013/0058372 A1 | 3/2013 | Emami | |
| 2013/0062333 A1 | 3/2013 | Emami | |
| 2013/0125592 A1* | 5/2013 | Bisson | C03B 23/0258 65/273 |

* cited by examiner

THERMAL PROCESS DEVICE WITH NON-UNIFORM INSULATION

RELATED APPLICATION DATA

This application claims priority of U.S. Provisional Application No. 62/371,525, filed Aug. 5, 2016, which the entirety thereof is incorporated herein by reference.

TECHNICAL FIELD

The present disclosure relates to a thermal process device for heat treating a product or plurality of products with improved temperature control.

BACKGROUND

Many products may undergo heat treatment in furnaces for different reasons. For example, in semiconductor wafer fabrication the semiconductor wafers undergo thermal curing, and in steel manufacturing the steel undergoes an annealing process for hardening the steel. Often in semiconductor production the temperature must be controlled very precisely as minor variations in the temperature can affect yields, the temperature may need to be controlled for a specific amount of time and often the temperature needs to be stabilized quickly so that the next step of manufacturing process may begin. Therefore it is imperative that heat treatment can be precisely controlled.

A typical thermal process device consists of a heating element assembly, comprising at least one buffer zone disposed at each of the distal ends and a plurality of controllable heating zones. The product is processed in the heating zones which are generally designed to achieve a high degree of thermal uniformity along its axial length. The buffer zones are used to supply additional energy to compensate for the heat losses from the openings at the distal ends of thermal process device. It is important to be able to improve energy efficiency from both a cost and environmental aspect. Examples of thermal process devices can be found where high efficiency insulation is installed across the entire assembly. This is effective for continuous furnaces, however the drawback of this is that the maximum cooling rate capacity of the thermal process device is reduced which can hinder throughput in dynamic systems. When improvements to the insulation are made across the entire element assembly to improve energy efficiency, it is often the case that the cooling rate in the central zone will decrease to a point where it can no longer sustain the desired cooling rates for the work. The typical approach is to either reduce the overall insulation efficiency in order to maintain the desired process performance or to decrease the controlled cooling rate. Consequently either only a minimal energy saving is made if the insulation is reduced or the process cycle time is extended and the system throughput is compromised if the insulation is maximised. Therefore, there is a need to increase the efficiency in dynamic systems whilst imparting minimal impact on the dynamic cooling rate.

SUMMARY

During cooling, the heat energy must be released from the work in the system and dissipated via a combination of conduction through the heating element assembly transfer to the gasses surrounding the work. The maximum cooling rate achievable at a given temperature is limited by the transfer rate of energy through the insulation system. The controlled rate that is selected is usually a little slower than the maximum rate of the system to insure that there is enough headroom to have a repeatable, controlled cooling process taking into consideration slight variations in system parameters including differences from heating element assembly to assembly. During the cooling phase, the end zones typically continue to operate at a higher power level since they are still used to supply additional heat to compensate for the losses while the center zone is only supplying enough power to keep the work cooling at the desired rate, therefore the central zone cooling rate becomes the limiting factor for the maximum cooling rate.

A typical three zone thermal process furnace has power consumption in the central zones in the range of 30-70% as the product is heating, whereas the buffer zones may operate at a power consumption of 35-90% while heating. Once the system stabilizes at the process temperature, the power consumption in the central zones drops to approximately 30% in order to maintain the desired temperature whereas the buffer zones will continue to operate at 40-80% in order to compensate for the increased heat loss. At the end of the active process cycle, the work must be cooled to a temperature that is appropriate for the extraction from the furnace assembly. It is usually desired to reduce the temperature of the work at a controlled rate and uniform temperature, at least through the initial phases.

Rather than improving the insulation across the entire length of the thermal process chamber the non-uniform application of insulating materials along the axial length of the heating element assembly, where the insulation at the end zones is maximized and the insulation disposed at the central portions of the heating element assembly normalized to achieve the desired cooling rate will reduce the overall energy consumption without impacting the throughput of the system. Furthermore, the useful life of the heating element assembly is increased due to the lower operating power required at the end zones of the heating element assembly.

One aspect of the present disclosure is to solve or at least reduce the above mentioned problems and drawbacks. The present disclosure therefore provides a thermal process device for heat treating a product or plurality of products includes a thermal processing chamber having opposed distal ends and at least one controllable heating zone. At least one buffer zone disposed is at each of the distal ends, the buffer zones and at least one heating zone of the thermal processing chamber forming a heating element assembly having an inner and outer surface. At least one layer of insulating material is disposed along the at least one buffer and heating zones of the thermal processing chamber and forming part of the heating element assembly, the at least one layer of insulating material having a controlled efficiency being applied non-uniformly across an axial length of the heating assembly.

The foregoing summary, as well as the following detailed description of the embodiments, will be better understood when read in conjunction with the appended drawings. It should be understood that the embodiments depicted are not limited to the precise arrangements and instrumentalities shown.

DETAILED DESCRIPTION

Figure 1:
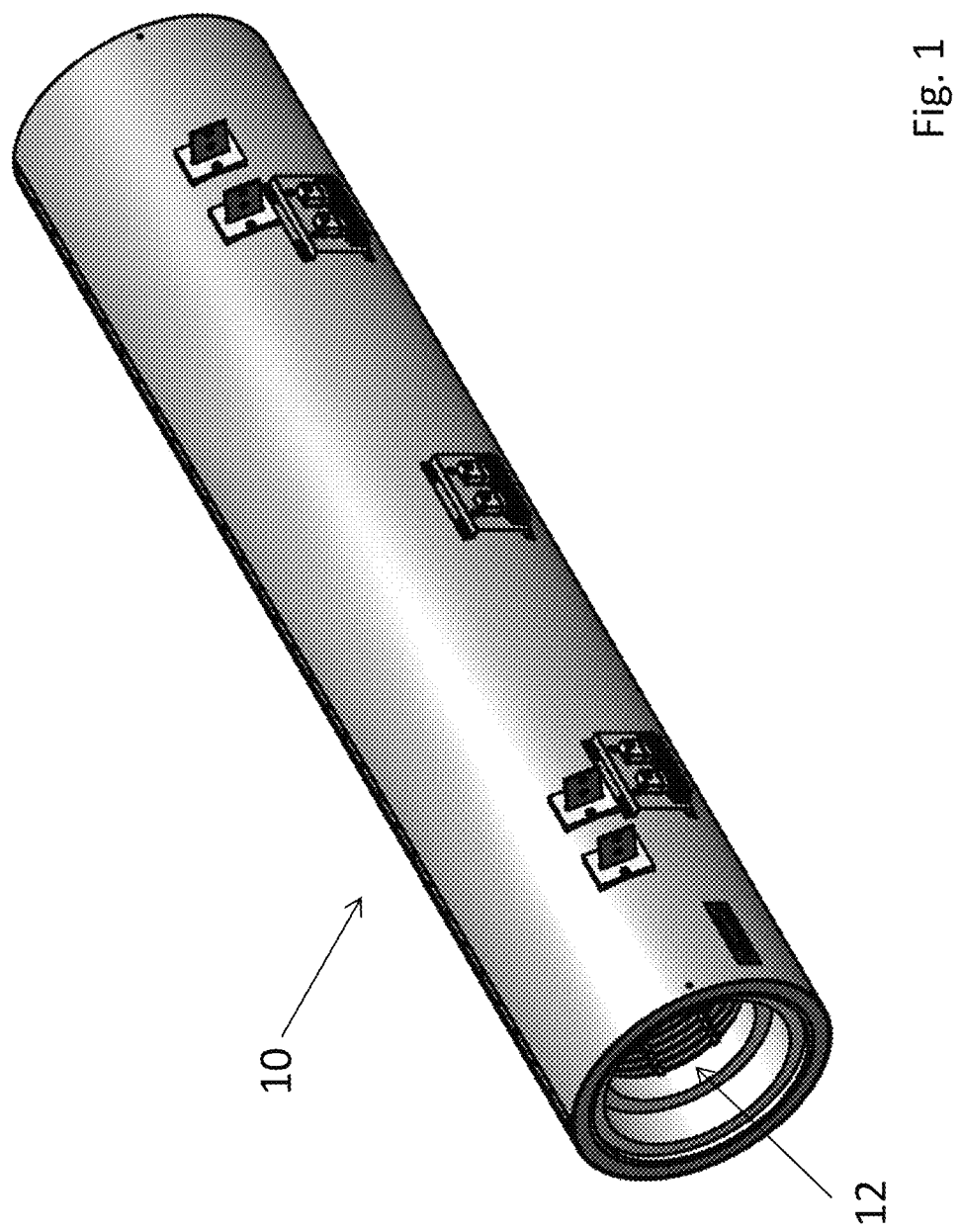
FIG. 1 is a perspective view of the thermal process device.
Figure 2:
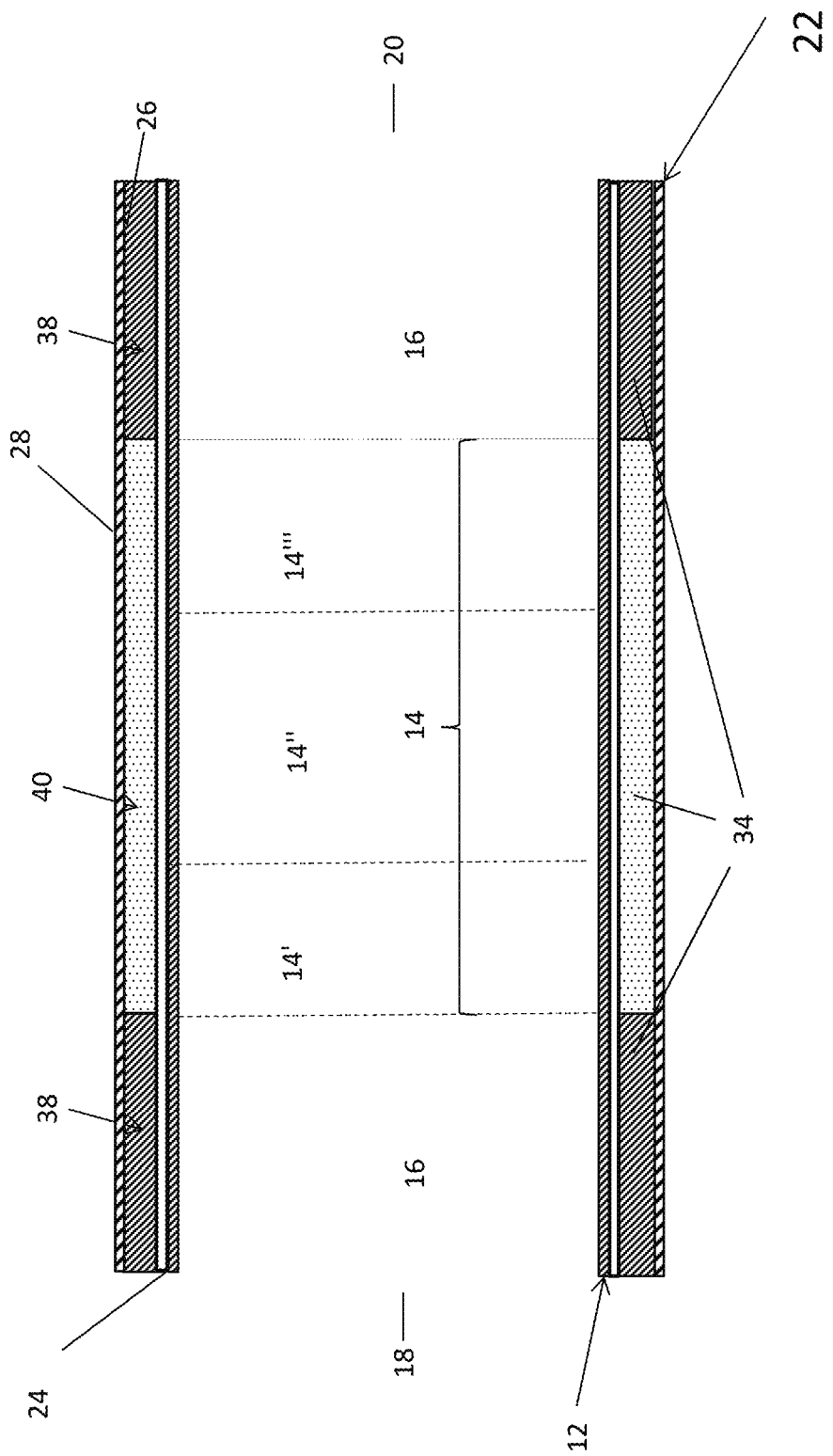
FIG. 2. is a cross-sectional view of the thermal processing chamber of FIG. 1.
Figure 3:
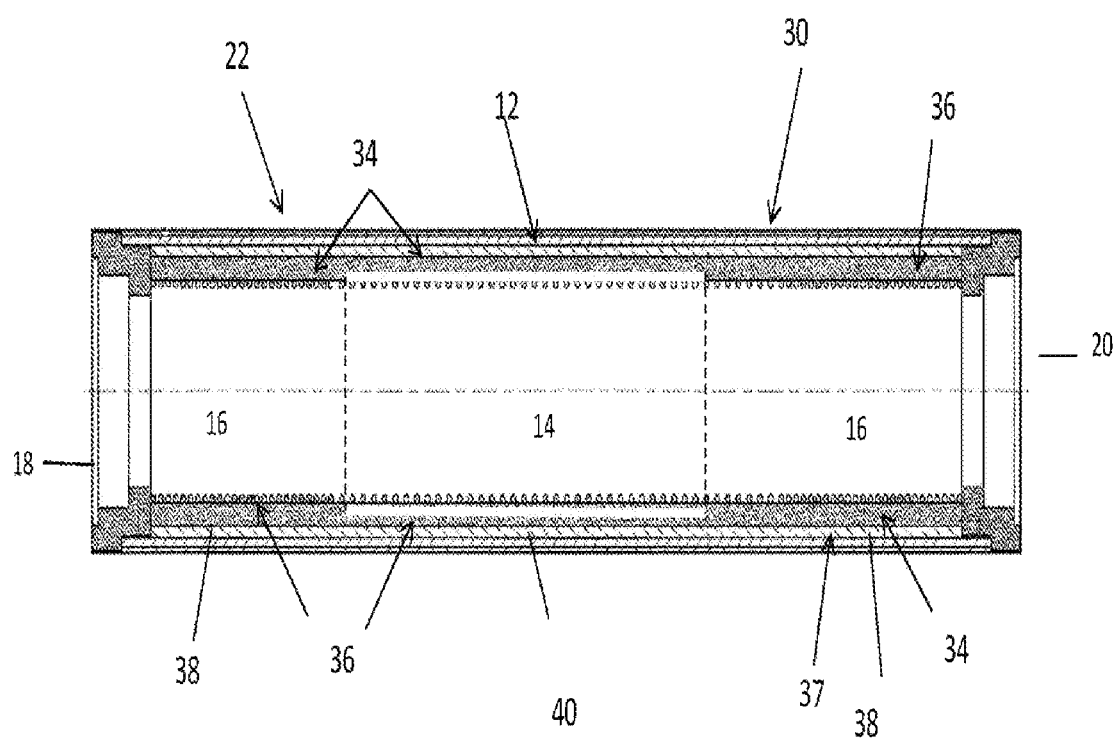
FIG. 3 is a cross-sectional view of the thermal processing chamber with non-uniform insulation.

Referring to FIGS. 1-3, a thermal process device 10 for heat treating a product or plurality of products includes a thermal processing chamber 12. The products to be treated may include semiconductor wafers, for example, for curing or doping or in the annealing of steel.

As shown in FIG. 2, chamber 12 has controllable heating zone 14 located in a central portion of the chamber. It should be appreciated that heating zone 14 can be a single or plural heating zones (14'-14"). Chamber 12 has an outer surface 24 and distal, opposed ends 18, 20. At least one buffer zone 16 is disposed at each of the distal ends 18, 20 of chamber 12. Together the buffer zones 16 and heating zones 14 of thermal processing chamber 12 form a heating element assembly 22. Thermal processing chamber 12 and heating element assembly 22 can be substantially cylindrical.

Referring to FIGS. 2 and 3, heating assembly 22 includes layers of insulating material 28 and 34. The insulating material can have a controlled efficiency as described further herein. Insulating material layer 34 is located between the outer surface 24 of processing chamber 12 and inner surface 26 of the outer layer 28. Thus, heating assembly 22 has an inner layer 34 and an outer layer 28 of insulation. It should be appreciated that a single or plurality of layers can be provided in the heating assembly 22.

As shown in FIG. 3, an outer shell 30 may disposed about the outer layer 28 of the heating element assembly 22. The layers of insulating material, for example, layer 34 can be applied non-uniformly across the length of the heating assembly. Non-uniformly means having one or more layers of material having the same or with different grades of thermal conductivity, the one or more layers having the same or different thicknesses, a layer having different thicknesses or different grades of thermal conductivity varying along its length, a layer or layers having different materials with different grades of thermal conductivity side-by-side along its length, the different portions having the same or different thicknesses, by using insulating material with different grades of thermal conductivity, by using differing arrangements of multiple layers of the insulating material, and a combination of all the above.

As shown in FIG. 2, the insulating layer(s) of the heating assembly can have a first insulation portion 38 with maximised efficiency in the buffer zones 16 and a second insulation portion 40 that has a lower efficiency can applied in the heating zones 14 in order to achieve the desired cooling rate. It should be appreciated that although only two side-by-side insulation portions are shown, numerous different insulation portions can be placed at various positions to form the non-uniform insulating layer as described above, depending on the heating and buffer zones.

Referring again to FIG. 3, insulating material 34 can have more than one layer. For example, insulating material 34 can have multiple layers 36 and 37. It should be appreciated that although two layers are shown, multiple layers can be provided. Layers 36 and 37 can have the same or different thicknesses. Also, the layers each can have the same thicknesses or a thickness that varies along the length of the assembly. For example, layer 36 of insulating material 34 can have a thickness at heating zone(s) 14 and second insulation portion 40 that is less than the thickness of layer 36 at first insulation portions 38. Thus, the efficiency of the insulation can for example, but not limited to, be controlled by varying the thickness, thermal conductivity grade of the insulation or differing arrangements of multiple layers of the insulating material in any combination along the axial length of the process chamber 12 as described supra.

The thermal process device can be any sort of multi-zone cooling process and could be used for a horizontal thermal processing chamber with a fluidic cooling system, as well as a vertical chamber.

Although the present embodiments have been described in relation to particular aspects therefore, many other variations and modifications and other uses will become apparent to those skilled in the art. It is preferred therefore, that the present embodiments be not limited by the specific disclosure herein, but only by the appended claims.

What is claimed is:

1. A thermal process device for heat treating a product or plurality of products, the device comprising:
   a thermal processing chamber having opposed distal ends and at least one controllable heating zone;
   at least one buffer zone disposed at each of the distal ends, the buffer zones and at least one heating zone of the thermal processing chamber forming a heating element assembly having an inner surface and an outer surface;
   an outer shell disposed about the outer surface of the heating element assembly;
   at least one inner layer of an insulation material disposed along the at least one buffer and heating zones of the thermal processing chamber and forming part of the heating element assembly, the at least one inner layer of insulation material having an insulation efficiency that varies non-uniformly across an axial length of the heating element assembly; and
   an outer layer of insulation material extending along the at least one buffer and heating zones of the thermal processing chamber,
   wherein the least one inner layer of an insulation material forms a layer that is located between an outer surface of the thermal processing chamber and an inner surface of the outer layer of insulation, and
   wherein a portion of the at least one layer of insulation material located at the at least one buffer zone has an insulation efficiency that is greater than the insulation efficiency of a portion of the at least one layer of insulation material at the at least one heating zone.

2. The thermal process device according to claim 1, wherein the thickness of the at least one inner layer of insulation material is varied across the axial length of the heating element assembly, which varies the insulation efficiency of the insulation material of the at least one inner layer of insulation material.

3. The thermal process device according to claim 1, wherein a grade of thermal conductivity of the at least one inner layer of insulation material is varied across the axial length of the heating element assembly, which varies the insulation efficiency of the at least one inner layer of insulation material.

4. The thermal process device according to claim 1, wherein the at least one inner layer of insulation material comprises multiple layers of insulation material, and wherein the arrangement of the multiple layers of the insulation material is varied across the axial length of the heating element assembly, which varies the insulation efficiency of the at least one inner layer of insulation material.

5. The thermal process device according to claim 4, wherein the multiple layers have the same thickness.

6. The thermal process device according to claim 4, wherein the multiple layers have different thicknesses.

7. The thermal process device according to claim 6, wherein the thickness of at least one of the multiple layers varies along a length of the processing chamber.

8. The thermal process device according to claim 7, wherein at least one layer of the multiple layers at the at least one heating zone has a thickness that is less than a layer of the multiple layers at the at least one buffer zone.

9. The thermal process device according to claim 3, wherein the insulation material of the at least one inner layer of insulation material has at least a first insulation portion and a second insulation portion, wherein the insulation material in the first insulation portion is different than the insulation material in the second insulation portion.

10. The thermal process device according to claim 4, wherein one a first layer of the multiple layers of insulation material includes insulation material that has a different grade of thermal conductivity than an insulation material of a second layer of the multiple layers of insulation material.

11. The thermal process device according to claim 4, wherein the insulation material of the at least one inner layer of insulation material has a first insulation portion and a second insulation portion, the first insulation portion and the second insulation portion arranged along the axial length of the heating element assembly, wherein the first insulation portion includes multiple layers of insulation material and the insulation material in each layer of the multiple layers has a different grade of thermal conductivity as compared to other layers of the multiple layers in the first insulation portion, wherein the second insulation portion includes multiple layers of insulation material and the insulation material in each layer of the multiple layers has a different grade of thermal conductivity as compared to other layers of the multiple layers in the second insulation portion, and wherein a sequence of the grade of thermal conductivity of the insulation material in each layer of the multiple layers in the first insulation portion differs from a sequence of the grade of thermal conductivity of insulation material in each layer of the multiple layers in the second insulation portion.

\* \* \* \* \*